(12) United States Patent
Maejima

(10) Patent No.: US 9,418,732 B2
(45) Date of Patent: Aug. 16, 2016

(54) SEMICONDUCTOR MEMORY DEVICE

(71) Applicant: KABUSHIKI KAISHA TOSHIBA, Tokyo (JP)

(72) Inventor: Hiroshi Maejima, Setagaya Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/630,505

(22) Filed: Feb. 24, 2015

(65) Prior Publication Data

US 2016/0078929 A1 Mar. 17, 2016

(30) Foreign Application Priority Data

Sep. 12, 2014 (JP) ................................. 2014-187055

(51) Int. Cl.
| | | |
|---|---|---|
| *G11C 11/00* | (2006.01) | |
| *G11C 16/24* | (2006.01) | |
| *G11C 11/56* | (2006.01) | |
| *G11C 16/26* | (2006.01) | |
| *G11C 16/34* | (2006.01) | |

(52) U.S. Cl.
CPC ............ *G11C 11/5642* (2013.01); *G11C 16/24* (2013.01); *G11C 16/26* (2013.01); *G11C 16/3459* (2013.01)

(58) Field of Classification Search
CPC ............... G11C 11/5642; G11C 16/10; G11C 11/5628; G11C 16/3418; G11C 2211/5641; G11C 2211/5621; G11C 2211/5642; G11C 16/12; G11C 2211/565; G11C 16/26; G11C 16/24; G11C 7/04; G11C 11/16; G11C 13/0023; G11C 13/004; G11C 13/0069
See application file for complete search history.

(56) References Cited

U.S. PATENT DOCUMENTS

| | | | |
|---|---|---|---|
| 6,178,115 B1 | 1/2001 | Shibata et al. | |
| 8,203,888 B2 | 6/2012 | Fukuda et al. | |
| 2011/0280070 A1* | 11/2011 | Kim ........................ | G11C 16/26 365/185.03 |
| 2013/0250698 A1* | 9/2013 | Kim ........................ | G11C 16/24 365/185.25 |
| 2014/0056069 A1* | 2/2014 | Park .................... | G11C 16/0483 365/185.05 |

FOREIGN PATENT DOCUMENTS

| | | |
|---|---|---|
| JP | 2011-070725 A | 4/2011 |
| WO | 2008154229 A1 | 12/2008 |

* cited by examiner

*Primary Examiner* — Hien Nguyen
(74) *Attorney, Agent, or Firm* — Patterson & Sheridan, LLP

(57) ABSTRACT

A semiconductor memory device includes a memory cell, a bit line electrically connected to a first end of the memory cell, a source line electrically connected to a second end of the memory cell, a sense amplifier electrically connected to the bit line, and a controller configured to perform a read operation including first and second read operations on the memory cell. During the first read operation, a pre-charge voltage is applied to the bit line and a source line voltage lower than the pre-charge voltage is applied to the source line, and during the second read operation, a first voltage that is greater than the source line voltage and less than the pre-charge voltage is applied to the bit line.

20 Claims, 12 Drawing Sheets

SEMICONDUCTOR MEMORY DEVICE

CROSS-REFERENCE TO RELATED APPLICATION

This application is based upon and claims the benefit of priority from Japanese Patent Application No. 2014-187055, filed Sep. 12, 2014, the entire contents of which are incorporated herein by reference.

FIELD

Exemplary embodiments described herein relate generally to a semiconductor memory device.

BACKGROUND

A NAND-type flash memory is known as a semiconductor memory device.

DETAILED DESCRIPTION

Figure 1:
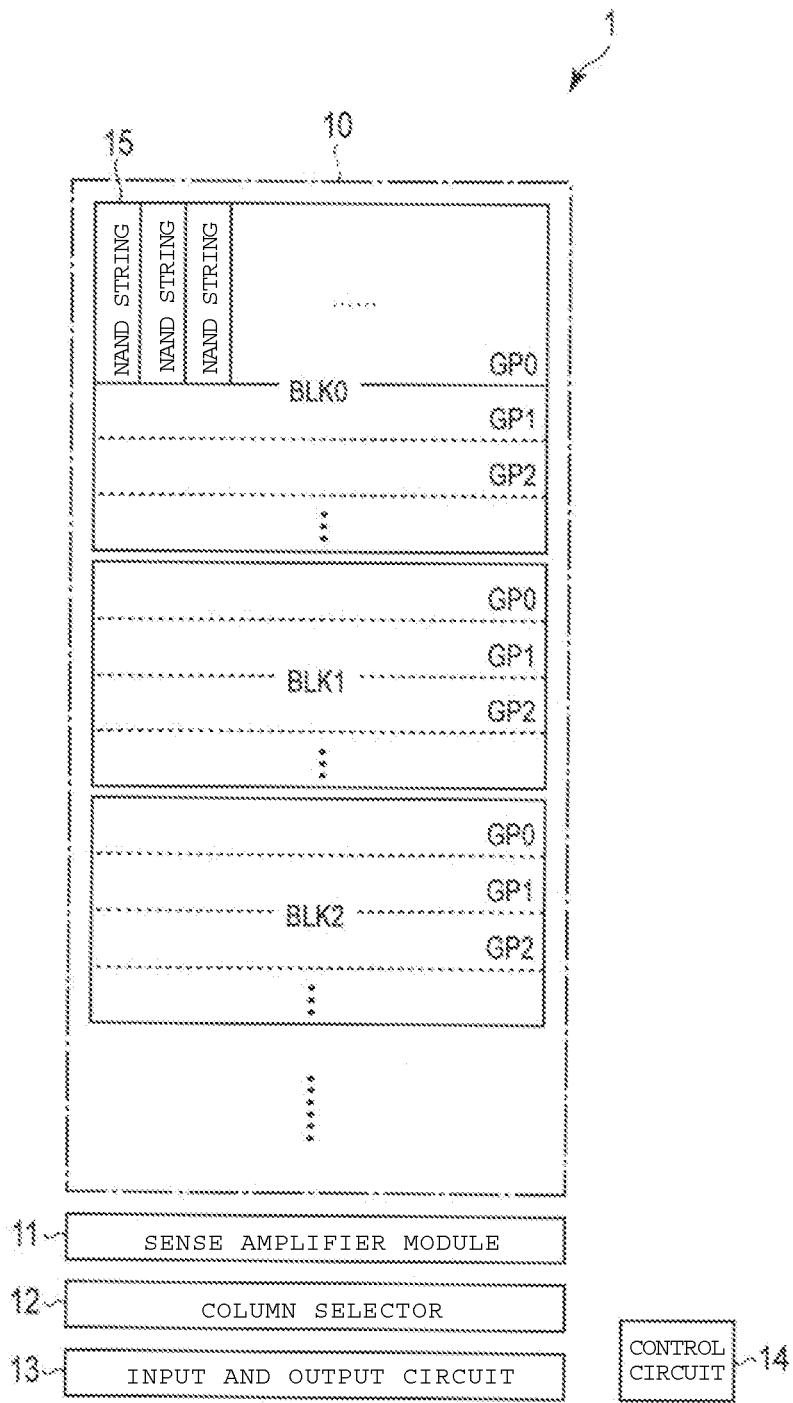
FIG. 1 is a block diagram illustrating a semiconductor memory device according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it maybe directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. maybe used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Provided is a semiconductor memory device capable of speeding up a read operation.

In general, according to one embodiment, a semiconductor memory device includes a memory cell, a bit line electrically connected to a first end of the memory cell, a source line electrically connected to a second end of the memory cell, a sense amplifier electrically connected to the bit line, and a controller configured to perform a read operation including first and second read operations on the memory cell. During the first read operation, a pre-charge voltage is applied to the bit line and a source line voltage lower than the pre-charge voltage is applied to the source line, and during the second read operation, a first voltage that is greater than the source line voltage and less than the pre-charge voltage is applied to the bit line.

Hereinafter, a semiconductor memory device of the embodiment will be described with reference to the drawings. In addition, in the following description, components having the same function and configuration are denoted by a common reference symbol. Hereinafter, a three-dimensional stacked NAND-type flash memory in which memory cells are stacked on a semiconductor substrate will be described as an example of the semiconductor memory device.

(First Embodiment)

A semiconductor memory device of a first embodiment will be described.

1. Configuration of Semiconductor Memory Device

First, the configuration of the semiconductor memory device of the first embodiment will be described.

1.1 Entire Configuration of Semiconductor Memory Device

FIG. 1 illustrates the entire configuration of the semiconductor memory device according to the first embodiment. As illustrated, a NAND-type flash memory 1 includes a memory cell array 10, a sense amplifier module 11, a column selector 12, an input and output circuit 13, and a control circuit 14.

The memory cell array 10 includes a plurality of blocks BLK (BLK0, BLK1, BLK2, . . . , BLKn-1) each of which includes a set of non-volatile memory cells. Data in the same block BLK is erased collectively. Each of the blocks BLK includes a plurality of memory groups GP (GP0, GP1, GP2, . . . , GPm-1), each of which includes a set of NAND strings 15, and each of the NAND strings 15 include memory cells connected in series. The number of blocks in the memory cell array 10 and the number of memory groups in the block are arbitrary. In addition, n, and m are natural numbers equal to or greater than 0.

The sense amplifier module 11 senses data which is read from the memory cell during data reading. Further, during data writing, the sense amplifier module 11 transfers write data to the memory cell. The sense amplifier module 11 includes a plurality of sense amplifier units, a latch circuit, a bus, and the like. These will be described in detail later.

The column selector 12 selects a column direction (a bit line which will be described later) of the memory cell array 10.

The input and output circuit 13 performs data exchange between an external controller of the NAND-type flash memory 1 and a host device. During data reading, the input and output circuit 13 outputs the data which is sense-amplified by the sense amplifier module 11 to the outside. Further, during data writing, the input and output circuit 13 receives write data from the outside, and transfers the write data to the sense amplifier module 11.

The control circuit 14 controls the entire operation of the memory cell array 10, the sense amplifier module 11, the column selector 12, and the input and output circuit 13 in the NAND-type flash memory 1.

1.2 Block Configuration of Memory Cell Array 10

Figure 2:
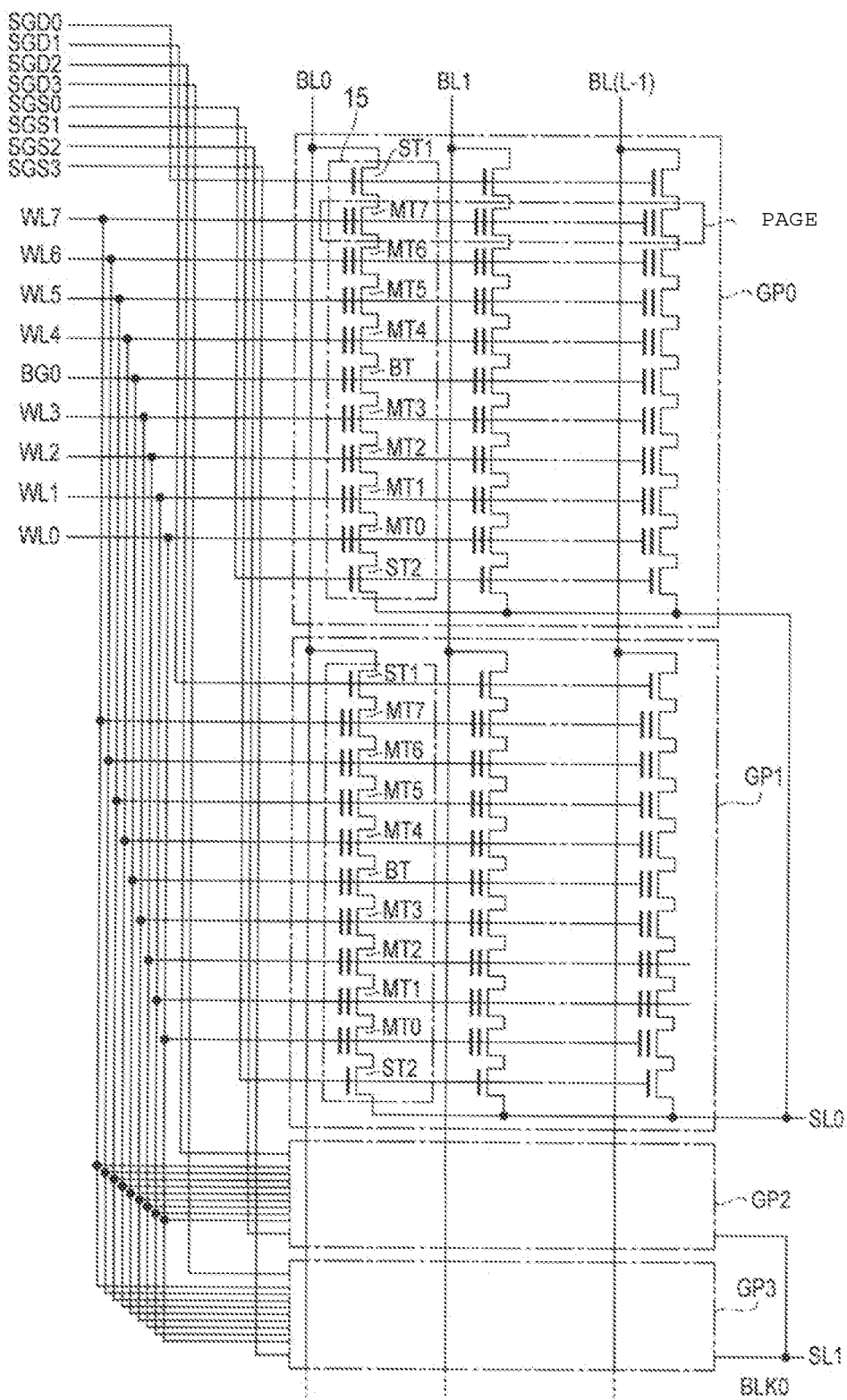
FIG. 2 is a circuit diagram illustrating a memory cell array according to the first embodiment.

The block configuration of the memory cell array 10 will be described. FIG. 2 illustrates a circuit diagram of a block BLK0. Other blocks BLK have the same configuration.

The block BLK0 includes a plurality of memory groups GP. Each memory group GP includes a plurality of (in this embodiment, L) NAND strings 15.

Each of the NAND strings 15 includes for example, 8 memory cell transistors (hereinafter, also referred to as a memory cell) MT (MT0 to MT7), selection transistors ST1, and ST2, and a back gate transistor BT.

The memory cell transistor MT includes a stacked gate including a control gate and a charge storage layer, and stores data in a non-volatile manner. In addition, the number of memory cell transistors MT is not limited to 8, and may be 16, 32, 64, 128, and the like, and the number may be any positive integer number.

The back gate transistor BT also includes a stacked gate including a control gate and a charge storage layer, similar to the memory cell transistor MT. The memory cell transistors MT and the back gate transistor BT are disposed so as to be directly connected between the selection transistors ST1, and ST2. In addition, the back gate transistor BT is not intended for storing data. The NAND string 15 may be of a type without a back gate.

The one end of the memory cell transistor MT7 at one end of the serial connection is connected to the one end of the selection transistor ST1, and the one end of the memory cell transistor MT0 at the other end of the serial connection is connected to the one end of the selection transistor ST2.

The gates of the selection transistors ST1 of the memory groups GP0 to GPm-1 are respectively connected to the select gate lines SGD0 to SGDm-1 in common, and the gates of the selection transistors ST2 are respectively connected to the select gate lines SGS0 to SGSm-1 in common. In contrast, the control gates of the memory cell transistors MT0 to MT7 in the same block BLK0 are respectively connected to the word lines WL0 to WL7 in common, and the control gate of the back gate transistor BT is connected to the back gate line BG in common. The control gates of the back gate transistors BT in the blocks BLK0 to BLKn-1 are respectively connected to the BG0 to BGn-1 in common.

In other words, whereas the word lines WL0 to WL7 and the back gate line BG are connected to common between a plurality of memory groups GP in the same block BLK0, the select gate lines SGD and SGS are independent for each memory group GP in the same block BLK0.

Further, among NAND strings 15 disposed in a matrix in the memory cell array 10, the other ends of the selection transistors ST1 of the NAND strings 15 in the same column are commonly connected to a certain bit line BL. In other words, the bit line BL connects the NAND strings 15 in common between a plurality of blocks BLK. The other end of the selection transistor ST2 is connected to a certain source line SL. The source line SL connects, for example, the NAND strings 15 in common between a plurality of memory groups GP.

As described above, data pieces in the memory cell transistors MT in the same block BLK are collectively erased. In contrast, data write and data read are collectively performed for a plurality of memory cell transistors MT connected in common to a certain word line WL, in a certain memory group GP of a certain block BLK. The read and write unit is referred to as a "page".

In the memory cell array 10 of the above configuration, the memory cell transistors MT, the selection transistors ST1 and ST2, and the back gate transistor BT are stacked three-dimensionally on a semiconductor substrate. In addition, for example, a portion of a peripheral circuit such as the sense amplifier module 11 is formed on the semiconductor substrate, and the memory cell array 10 is formed on the peripheral circuits.

The configuration of the memory cell array 10 is not limited to the above-described example. The configuration of the memory cell array 10 may adopt the one described in, for example, U.S. patent application Ser. No. 12/407,403, filed Mar. 19, 2009, entitled "a three-dimensional stacked non-volatile semiconductor memory". Further, the configuration may adopt the one described in U.S. patent application Ser. No. 12/406,524, filed Mar. 18, 2009, entitled "a three-dimensional stacked non-volatile semiconductor memory", U.S. patent application Ser. No. 12/679,991, filed Mar. 25, 2010, entitled "anon-volatile semiconductor memory device and a fabrication method thereof", or U.S. patent application Ser. No. 12/532,030, filed Mar. 23, 2009, entitled "a semiconductor memory and a fabrication method thereof". The entire contents of these patent applications are incorporated herein by reference.

1.3 Configuration of Sense Amplifier Module 11

Figure 3:
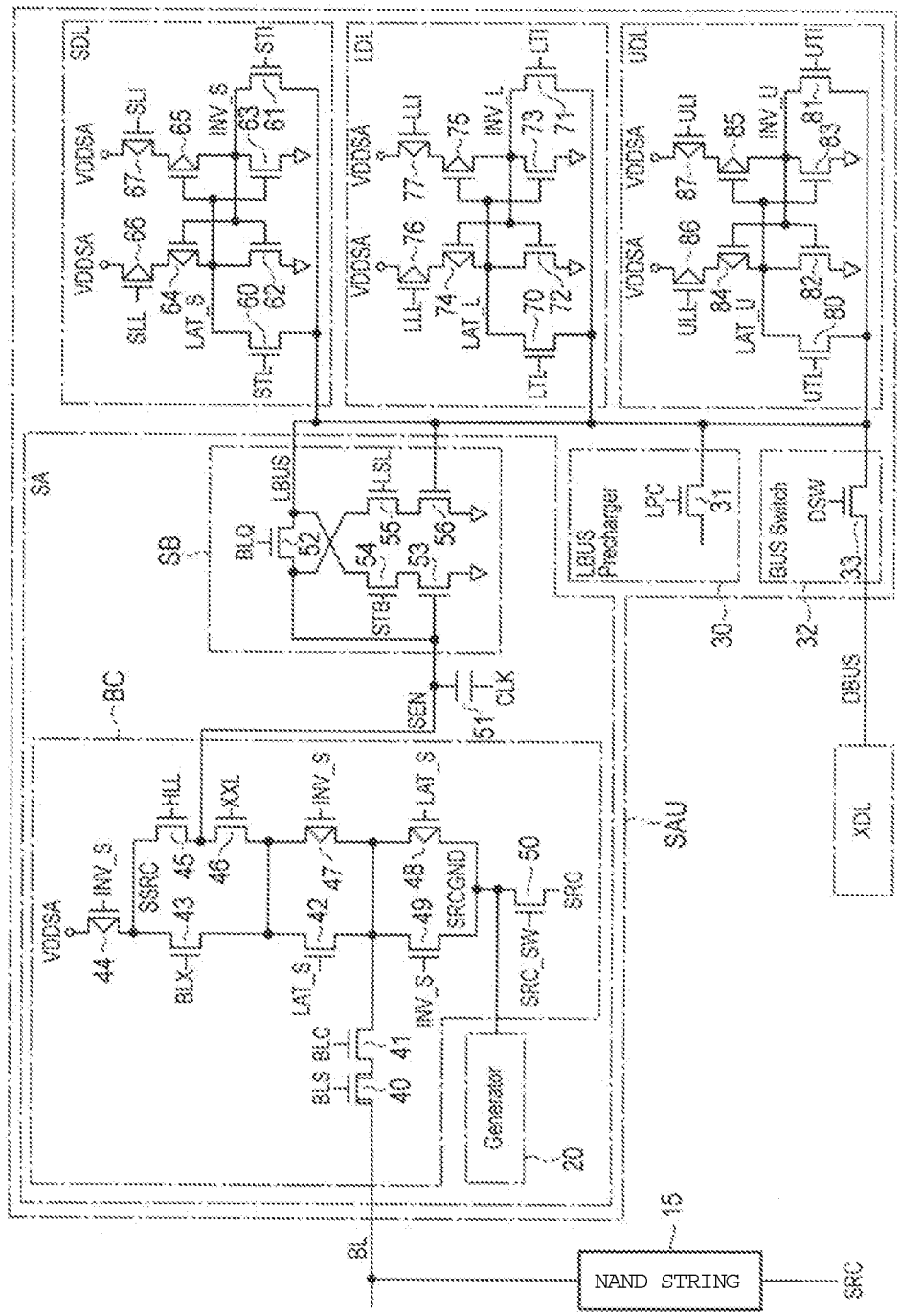
FIG. 3 is a circuit diagram illustrating a sense amplifier unit according to the first embodiment.

As illustrated in FIG. 3, the sense amplifier module 11 includes a sense amplifier unit SAU and a latch circuit XDL. The sense amplifier unit SAU and the latch circuit XDL are provided in each bit line BL. In other words, a set of one sense amplifier unit SAU and one latch circuit XDL is provided for one bit line BL.

With reference to FIG. 3, the configuration of the sense amplifier unit SAU and the latch circuit XDL will be described. The sense amplifier unit SAU senses and amplifies data read from the corresponding bit line BL, and transfers the data to the corresponding bit line BL. The latch circuit XDL is also provided for each bit line BL, and temporarily stores the data related to the corresponding bit line BL.

The data exchange between the sense amplifier unit SAU and the input and output circuit 13 is performed through the latch circuit XDL. The latch circuit XDL is used for cache operation of the NAND-type flash memory 1. The sense amplifier unit SAU includes a plurality of latch circuits. Therefore, even if the latch circuits are in use, if the latch circuit XDL is empty, the NAND-type flash memory 1 may receive data from the outside.

The sense amplifier unit SAU and the latch circuit XDL are connected so as to transmit and receive data with each other through a bus DBUS. The bus DBUS is shared by a plurality of (for example, 16) sense amplifier units SAU.

Next, the detailed configuration of the sense amplifier unit SAU will be continuously described with reference to FIG. 3. The sense amplifier unit SAU includes a sense amplifier unit SA, three latch circuits SDL, UDL, and LDL, a pre-charge circuit 30, and a bus switch 32.

The sense amplifier unit SA is a module that directly controls the bit line BL. The sense amplifier unit SA senses data which is read from the bit line BL, and applies a voltage to the bit line BL depending on the write data. The latch circuits SDL, UDL, and LDL temporarily store data. During data writing, for example, the sense amplifier unit SA controls the potential of the bit line BL, depending on the stored data of the latch circuit SDL among three latch circuits. Further, the data which is sensed by the sense amplifier unit SA is first stored in, for example, the latch circuit SDL. The other latch circuits UDL and LDL are used for a multilevel operation in which each memory cell stores two or more bits of data, or a so-called Quick pass operation. The sense amplifier unit SA and three latch circuits SDL, UDL, and LDL are connected by a bus LBUS such that they may transmit and receive data with each other.

The sense amplifier unit SA includes a bit line control unit BC, a voltage generation circuit 20, and a strobe unit SB. The bit line control unit BC controls the potential of the bit line BL, and senses the data stored in the memory cell. The voltage generation circuit 20 generates a potential SRCGND to be supplied to the bit line BL. The strobe unit SB transfers the data which is read through the bus LBUS, to the latch circuit SDL.

The bit line control unit BC, n-channel MOS field effect transistors (hereinafter, referred to as nMOS transistors) 40 to 43, 45 to 46, 49, 50, and p-channel MOS field effect transistors (hereinafter, referred to as pMOS transistors) 44, 47, and 48. The nMOS transistor 40 is a high breakdown voltage transistor, and the other transistors are low breakdown voltage transistors.

The nMOS transistor 40 has one end connected to the corresponding bit line BL, and a gate to which a signal BLS is applied. The nMOS transistor 41 has one end connected to the other end of the nMOS transistor 40, and a gate to which a signal BLC is applied. The nMOS transistor 41 clamps the corresponding bit line BL to a potential according to the signal BLC.

The nMOS transistor 42 has one end connected to the other end of the nMOS transistor 41, and a gate to which a signal LAT_S is input. The nMOS transistor 43 has one end connected to the other end of the nMOS transistor 42, and the other end connected to a node SSRC, and gate to which a signal BLX is input. The pMOS transistor 44 has one end connected to the node SSRC, the other end to which a power voltage VDDSA is applied, and a gate connected to a node INV_S.

The nMOS transistor 45 has one end connected to the node SSRC, the other end connected to a node SEN, and a gate to which a signal HLL is applied. The nMOS transistor 46 has one end connected to the node SEN, and a gate to which a signal XXL is input. The pMOS transistor 47 has one end connected to the other end of the nMOS transistor 46, and a gate to which a signal INV_S is input.

The nMOS transistor 49 has one end connected to other end of the nMOS transistor 41, the other end connected to a node SRCGND, and a gate connected to the node INV_S. The nMOS transistor 50 has one end connected to the node SRCGND, the other end to which a voltage SRC (for example, 0V) is supplied, and a gate to which a signal SRC_SW is input. The pMOS transistor 48 has one end connected to the node SRCGND, the other end connected to the other end of the nMOS transistor 41, and a gate to which the signal LAT_S is input. Further, the voltage generation circuit 20 is connected to the node SRCGND.

The strobe unit SB includes low breakdown voltage nMOS transistors 52 to 56. The nMOS transistor 53 has one end which is grounded, and a gate connected to the node SEN. The nMOS transistor 54 has one end connected to the other end of the nMOS transistor 53, the other end connected to the bus LBUS, and a gate to which a control signal STB is input.

The nMOS transistor 52 has one end connected to the node SEN, the other end connected to the bus LBUS, and a gate to which a control signal BLQ is input. The nMOS transistor 56 has one end which is grounded, and a gate connected to the bus LBUS. The nMOS transistor 55 has one end connected to the other end of the nMOS transistor 56, the other end connected to the node SEN, and a gate to which a control signal LSL is input.

A capacitor element 51 has one electrode connected to the node SEN, and the other electrode to which a clock CLK is input.

Next, the latch circuit SDL will be described with reference to FIG. 3. As illustrated in FIG. 3, the latch circuit SDL includes low breakdown voltage nMOS transistors 60 to 63, and low breakdown voltage pMOS transistors 64 to 67.

The nMOS transistor 60 has one end connected to the bus LBUS, the other end connected to a node LAT_S, and a gate to which a control signal STL is input. The nMOS transistor 61 has one end connected to the bus LBUS, the other end connected to the node INV_S, and a gate to which a control signal STI is input. The nMOS transistor 62 has one end which is grounded, the other end connected to the node LAT_S, and a gate connected to the node INV_S. The nMOS transistor 63 has one end which is grounded, the other end connected to the node INV_S, and a gate connected to the node LAT_S. The pMOS transistor 64 has one end connected to the node LAT_S, and a gate connected to the node INV_S. The pMOS transistor 65 has one end connected to the node INV_S, and a gate connected to the node LAT_S. The pMOS transistor 66 has one end connected to the other end of the pMOS transistor 64, the other end to which a power voltage VDDSA is applied, and a gate to which a control signal SLL is input. The pMOS transistor 67 has one end connected to the other end of the pMOS transistor 65, the other end to which a power voltage VDDSA is applied, and a gate to which a control signal SLI is input.

In the latch circuit SDL, the nMOS transistor 62 and the pMOS transistor 64 form a first inverter, and the nMOS transistor 63 and the pMOS transistor 65 form a second inverter. Then, the output of the first inverter and the input (the node LAT_S) of the second inverter are connected to the bus LBUS through the nMOS transistor 60 for data transfer. The input of the first inverter and the output (the node INV_S) of the second inverter are connected to the bus LBUS through the nMOS transistor 61 for data transfer. The latch circuit SDL holds data at the node LAT_S, and holds inverted data at the node INV_S.

Since the latch circuits LDL and UDL have the same configuration as that of the latch circuit SDL, the description thereof will be omitted, but the reference numbers of respective transistors and the names of control signals are different from those of the latch circuit SDL as illustrated in FIG. 3.

The pre-charge circuit 30 pre-charges the bus LBUS. The pre-charge circuit 30 includes, for example, a low breakdown voltage nMOS transistor 31, one end is connected to the bus LBUS, and a control signal LPC is applied to a gate.

The bus switch 32 connects the sense amplifier unit SAU to the latch circuit XDL, by connecting the bus DBUS and the bus LBUS. In other words, the bus switch 32 includes, for example, a low breakdown voltage nMOS transistor 33, one end is connected to the bus DBUS, the other end is connected to the bus LBUS, and a control signal DSW is applied to a gate.

2. Data Read Operation

Next, a data read operation in the first embodiment will be described. The read operation is performed by the sense amplifier unit SA, for example, by the control circuit 14 controlling various control signals.

Figure 4:
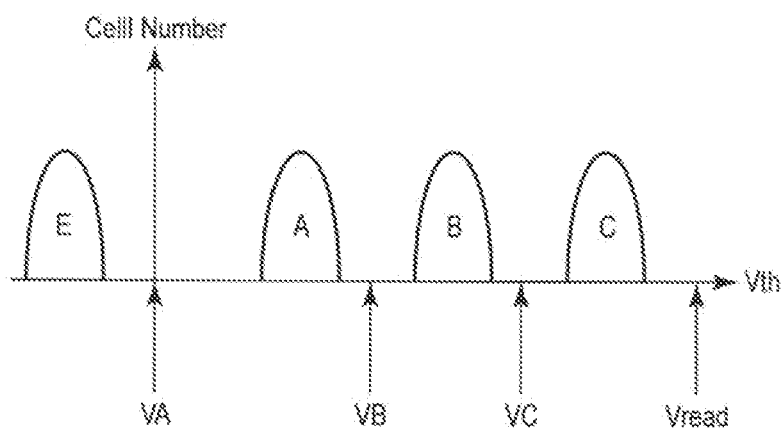
FIG. 4 is a diagram illustrating a threshold level according to a memory cell according to the first embodiment.

Each memory cell may store two bits or more of data. When storing two bits of data, the memory cell has one of four threshold voltages (also referred to as threshold levels) as illustrated in FIG. 4. Four threshold levels are referred to as an E level, an A level, a B level, and a C level in an ascending order of a threshold level. One memory cell may store two bits of data by assigning a specific value to each of the four levels. Each memory cell may store "1" (low threshold) data and "0" (high threshold) data for each of the lower and upper bits. However, in practice, in a plurality of memory cells designed to have the same threshold voltage, the threshold voltage varies due to variations in characteristics between cells. As a result, the threshold voltage has a distribution as illustrated in FIG. 4.

The reading of memory cell having any of four threshold voltages (hereinafter, a four-value cell) includes a reading of a lower bit and a reading of the subsequent upper bit. In the reading of a lower bit, it is determined whether the memory cell has either the E level or the A level, or the B level or the C level. Therefore, a voltage VB is applied to the selected word line WL. The voltage VB is between the upper end of an A-level distribution and the lower end of a B-level distribution. It is determined that the memory cell having a threshold level equal to or lower than the voltage VB has the E level or the A level. It is determined that the memory cell having a threshold level greater than the voltage VB has the B level or the C level.

In the reading of an upper bit, an A-level reading and a C-level reading are performed. In the A-level reading, the voltage VA is applied to the selected word line, and it is determined whether the memory cell has the E-level or the A-level. The voltage VA is between the upper end of an E-level distribution and the lower end of an A-level distribution. The memory cell having a threshold level equal to or lower than the voltage VA is determined to have the E-level, and the memory cell having a threshold level greater than the voltage VA is determined to have the threshold level of the A-level.

In the C-level reading, a selection word transition voltage VC is applied, and it is determined whether the memory cell has the B level or the C level. The voltage VC is between the upper end of a B-level distribution and the lower end of a C-level distribution. The memory cell having a threshold level equal to or lower than the voltage VC is determined to have the B level, and the memory cell having a threshold level greater than the voltage VC is determined to have the C level.

For example, the A-level reading includes a scheme of performing read twice (hereinafter, referred to as a two-time reading scheme), and a scheme of performing read once (hereinafter, referred to as a one-time reading scheme). Whether the threshold level is the E level or the A level is determined by performing read twice in the two-time reading scheme, and by performing read once in the one-time reading scheme, respectively. Similarly, the C-level reading also includes the two-time reading scheme and the one-time reading scheme.

The voltage Vread has a value greater than the upper end of the C-level distribution. If the memory cell receives a voltage Vread, the memory cell is turned on regardless of the value of the threshold level.

2.1 Two-Time Reading Scheme

Figure 5:
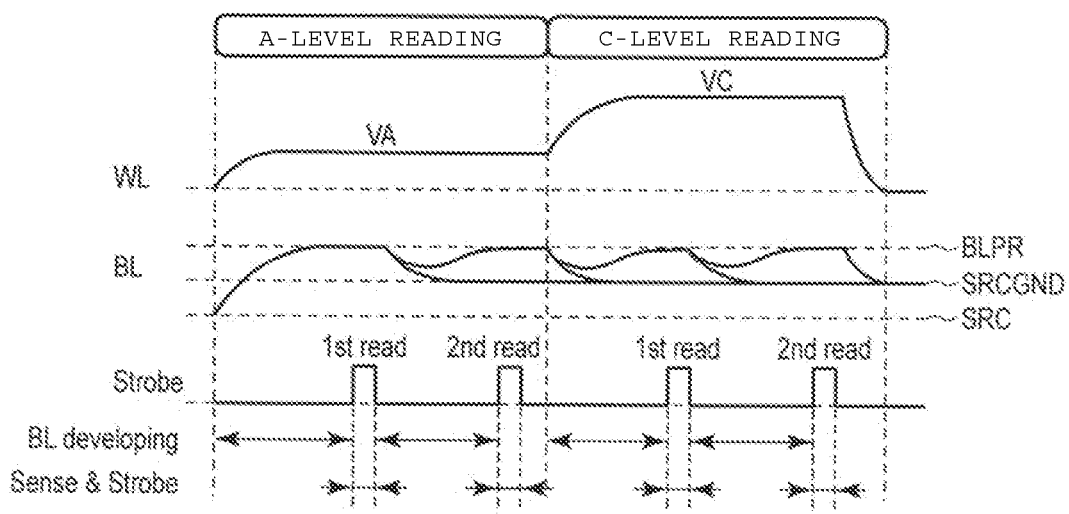
FIG. 5 is a timing chart illustrating a read operation of the semiconductor memory device according to the first embodiment.

A case of applying a two-time reading scheme to the reading of an upper bit for the four-value cell will be described with reference to FIG. 5.

The control circuit 14 first performs the A-level reading by performing read twice. Specifically, the control circuit 14 first performs a first data reading for the A-level reading. This reading is collectively performed for all bit lines BL of the memory cell that is turned on during the reading of a lower bit.

In this reading, the control circuit 14 first applies the voltage VA to the selected word line WL, and thereafter applies the voltage Vread to the non-selected word line WL. Further, the control circuit 14 sets the voltage of the bit line BL to the pre-charge voltage BLPR. By the start of sensing, the memory cell is turned on, or is maintained off, depending on the threshold level. In the bit line BL of the turned-on memory cell, a cell current flows from the bit line BL to the source line SL, and thus the voltage of the bit line BL is significantly reduced. Meanwhile, in the bit line BL of the memory cell that is maintained off, the cell current does not flow. The sense amplifier module 11 determines whether the threshold level of the memory cell is the E-level or the A-level, depending on whether or not the cell current flows. However, in reality, since the cell current flows even from the bit line BL of the memory cell that is maintained to be off, due to a current leakage, the voltage of the bit line BL is slightly reduced, and the control circuit 14 determines the threshold level based on the amount of reduction of the voltage in the bit line BL.

Next, the control circuit 14 performs a second reading for the A-level reading. Specifically, the control circuit 14 sets again the voltage of the bit line BL of the memory cell that is maintained to be off (a cell current does not flow) during the first reading, to the pre-charge voltage BLPR. Further, the control circuit 14 maintains the voltage of the bit line BL of the memory cell that is turned on (a cell current flows) during the first reading, to the voltage SRCGND. The voltage SRCGND has a magnitude between the pre-charge voltage BLPR and the voltage SRC (for example, 0V) of the source line SL, for example, an intermediate size between the voltage BLPR and the voltage SRC, and is generated by the voltage generation circuit 20. By the start of sensing, in the bit line BL of the turned-on memory cell, the cell current flows from the bit line BL to the source line SL. The sense amplifier module 11 determines whether the threshold level of the memory cell is the E-level or the A-level, depending on whether or not the cell current flows.

Next, the control circuit 14 performs a first reading and a second reading for the C-level. The C-level reading uses a voltage VC instead of the voltage VA in the A-level reading. The other steps during the C-level reading are the same as the corresponding steps during the A-level reading. The first reading of the C-level is collectively performed for all bit lines BL of the memory cell that is maintained to be off during the reading of a lower bit. In this reading, the voltage VC is used as described above, in the bit line BL of the turned-on memory cell, a cell current flows from the bit line BL to the source line SL, and in the bit line BL of the memory cell that is maintained to be off, a cell current does not flow. Next, even in the second reading for the C-level, the control circuit 14 maintains the voltage of the bit line BL of the memory cell that is turned on (where the cell current flows) during the first reading, to the voltage SRCGND. Subsequently, by the sensing, the sense amplifier module 11 determines whether the threshold level of the memory cell is the B-level or the C-level, depending on whether or not the cell current flows.

2.2 One-Time Reading Scheme

Figure 6:
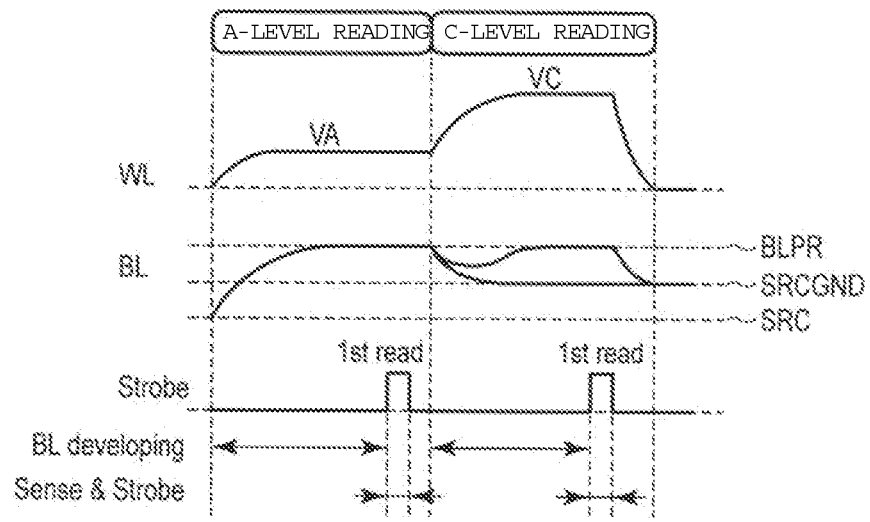
FIG. 6 is a timing chart illustrating a read operation of the semiconductor memory device according to the first embodiment.

A case of applying the one-time reading scheme to the reading of an upper bit for the four-value cell will be described with reference to FIG. 6.

The control circuit 14 first performs the A-level reading by performing the read just once. This reading is collectively performed for all bit lines BL of the memory cell that is turned on during the reading of a lower bit. During this reading, the control circuit 14 first applies the voltage VA to the selected word line WL, and thereafter applies the voltage Vread to the non-selected word line WL. Further, the control circuit 14 sets the voltage of the bit line BL to the pre-charge voltage BLPR. By the start of sensing, the memory cell is turned on or is maintained to be off, depending on the threshold level. In the bit line BL of the turned-on memory cell, the cell current flows from the bit line BL to the source line SL, and the voltage of the bit line BL is significantly reduced. Meanwhile, in the bit line BL of the memory cell that is maintained to be off, a cell current does not flow. The sense amplifier module 11 determines whether the threshold level of the memory cell is the E-level or the A-level, depending on whether or not the cell current flows.

Next, the control circuit 14 performs the C-level reading. First, the control circuit 14 sets again the voltage of the bit line BL of the memory cell that is turned on during the A-level reading to the pre-charge voltage BLPR. On the other hand, the control circuit 14 maintains the voltage of the bit line BL of the memory cell that is maintained off during the first reading to the voltage SRCGND. Thereafter, the control circuit 14 applies a voltage VC to the selected word line WL. Subsequently, the sense amplifier module 11 determines whether the threshold level of the memory cell is the B-level or the C-level, depending on whether or not the cell current flows.

2.3 Modification

Next, a modification of the read operation illustrated in FIG. 5 will be described with reference to FIG. 7. In the example shown in FIG. 5, the control circuit 14 sets the voltages of the bit lines of the memory cell that is turned on to the same voltage, during the A-level reading and the C-level reading. However, in the modification, the control circuit 14 sets the voltages of the bit line BL of the memory cell that is turned on to different voltages, during the A-level reading and the C-level reading.

Figure 7:
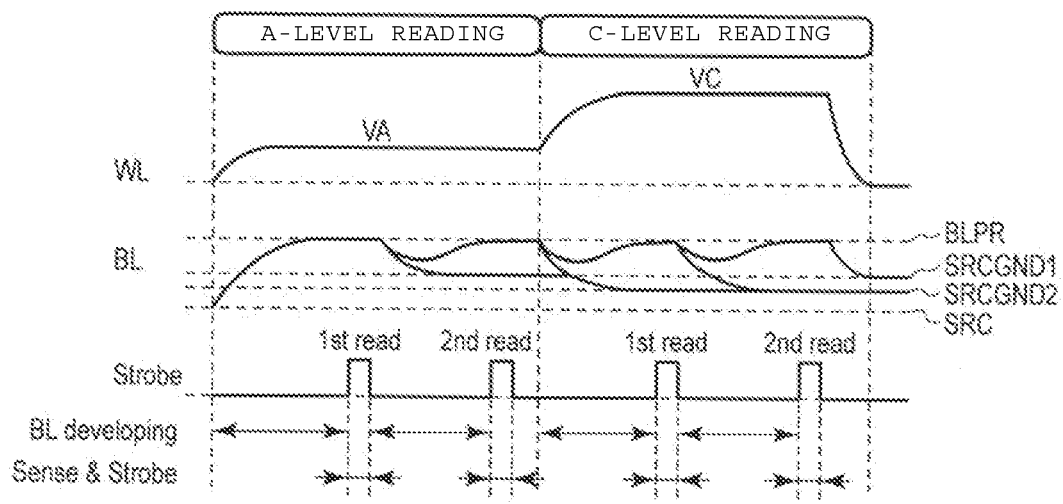
FIG. 7 is a timing chart illustrating a read operation of a semiconductor memory device according to a modification of the first embodiment.

In other words, as illustrated in FIG. 7, the control circuit 14 maintains the voltage of the bit line BL of the memory cell that is turned on during the first reading, to a voltage SRCGND1, in the A-level reading. The voltage SRCGND1 has a magnitude between the pre-charge voltage BLPR and the source line voltage SRC, and is generated by the voltage generation circuit in the sense amplifier unit SA.

Further, the control circuit 14 maintains the voltage of the bit line BL of the memory cell that is turned on during the first reading of the C-level reading, to a voltage SRCGND2. The voltage SRCGND2 has a magnitude different from the voltage SRCGND1, for example, a magnitude between the voltage SRC and the voltage SRCGND1, and is generated by the voltage generation circuit in the sense amplifier unit SA.

The voltages of three types or more may be applied to the bit line BL of the turned-on memory cell. For example, when the NAND-type flash memory 1 stores values of the number greater than four (for example, 8 values) in one memory cell, the voltages SRCGND of three types or more is used. In other words, similar to the case where the voltages SRCGND1 and SRCGND2 are used only for the A-level reading and the C-level reading in the case of four values, another voltage SRCGNDx would be used for the reading of further levels.

2.4 Sense Amplifier Unit

Figure 8:
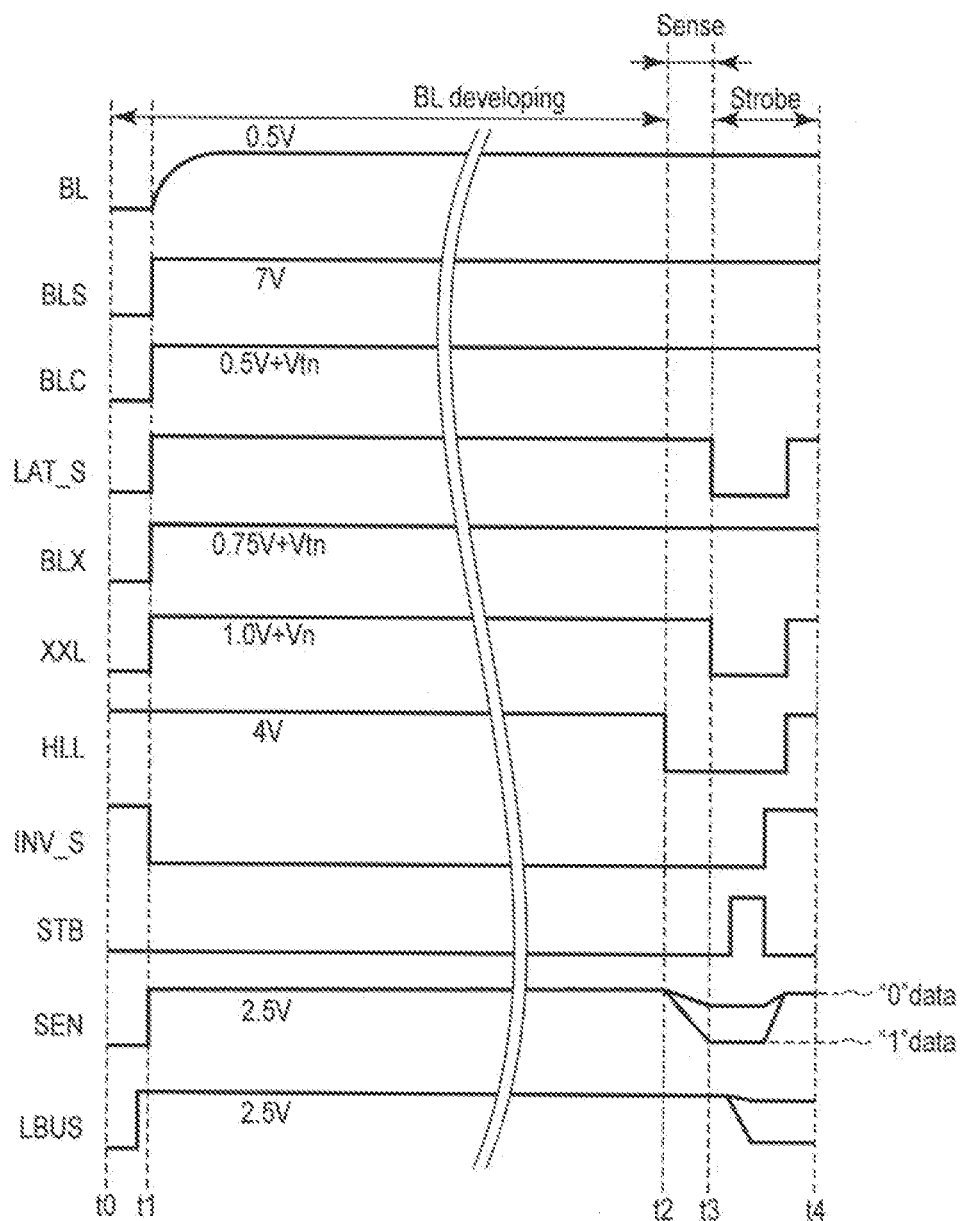
FIG. 8 is a diagram illustrating potential changes in various control signals and nodes during the read operation according to the first embodiment.

Next, the operation of the sense amplifier unit SA during the read operation will be described with reference to FIG. 8. In addition, FIG. 8 illustrates a flowchart during the one-time reading. The sense amplifier unit SA operates by, for example, the various control signals from the control circuit 14.

As illustrated prior to time t2 in FIG. 8, the bit line BL is first pre-charged for reading. At the initial state, the signals BLS, BLC, LAT, and BLX are at a "H" level, and the node INV_S is at a "L" level, such that the bit line BL is precharged to, for example, 0.5 V, through the pMOS transistor 44 and the nMOS transistors 40 to 43.

At this time, the signal HLL is also at the "H" level, such that the capacitor element 51 is charged, and the voltage of the node SEN is increased to, for example, about 2.5 V.

Next, at the time t2, the signal HLL is at the "L" level, and a data sensing is performed. As illustrated in FIG. 8, since the signal HLL is at the "L" level, the signal XXL is at the "H" level, the signal INV_S is at the "L" level, and the signal LAT_S is at the "H" level, the charges stored in the capacitor element 51 are discharged in accordance with the cell current flowing to the bit line BL.

As a result, the voltage of the node SEN is lowered to a certain voltage V1 from 2.5 V. If the data that the memory cell stores is "1" data, a significantly large cell current flows from the bit line BL to the source line SL. Therefore, the voltage V1 is also significantly reduced. Meanwhile, if the stored data is "0" data, the current flowing from the bit line BL to the source line SL is small. Accordingly, the voltage V1 becomes higher than in the above-described case.

As illustrated, at the time t3, the signal XXL is at the "L" level, and the transistor 46 is in an off state. As a result, the sensed data is stored at the node SEN. Thereafter, the data stored at the node SEN is input to the latch SDL. Thus, data sensing is ended.

Figure 9:
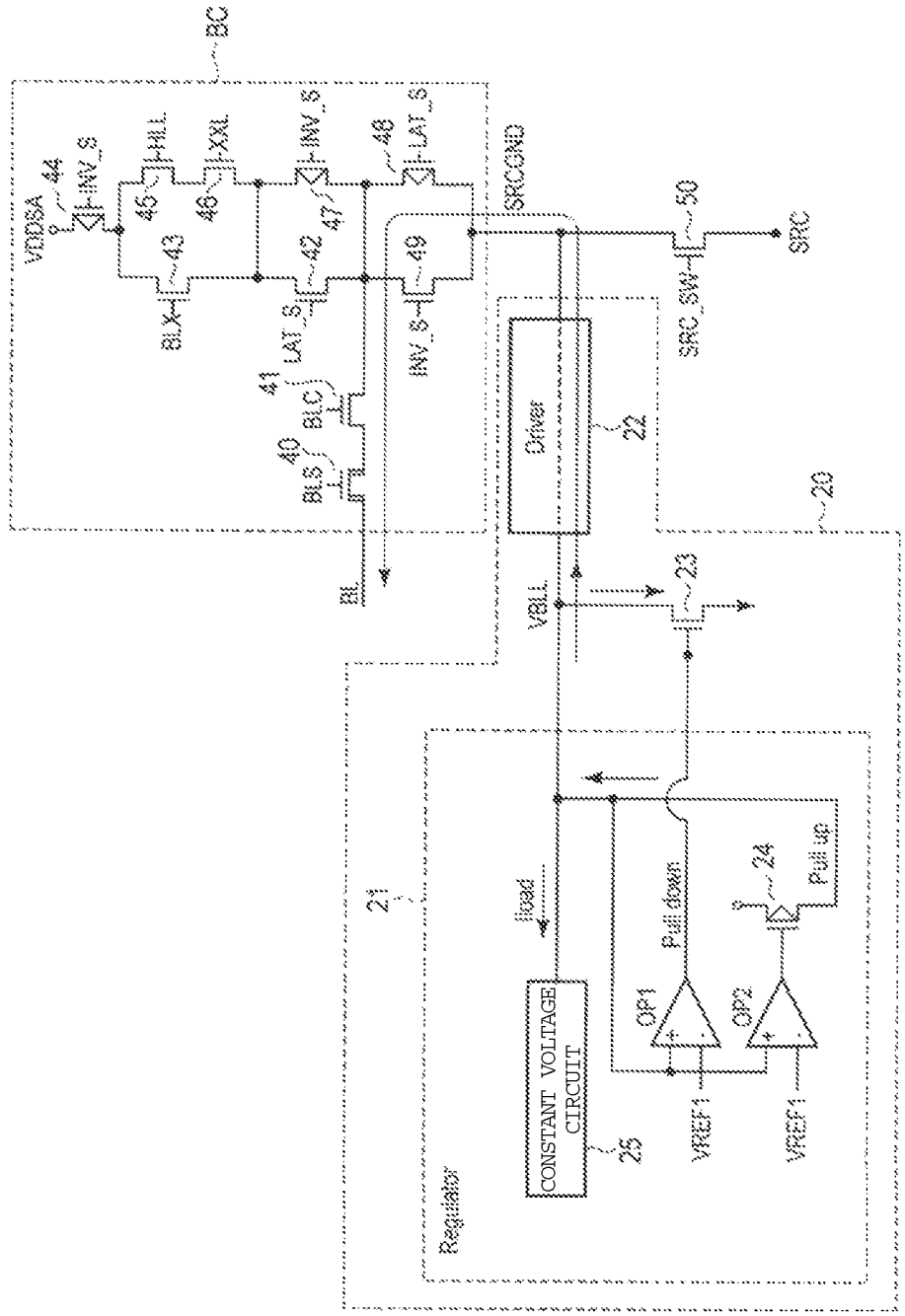
FIG. 9 is a circuit diagram illustrating a voltage generation circuit in the sense amplifier according to the first embodiment.

Next, the voltage generation circuit 20 will be described with reference to FIG. 9. FIG. 9 illustrates the configuration of the voltage generation circuit 20. The voltage generation circuit 20 generates the voltage SRCGND at the node SRCGND during the read operation.

As illustrated in FIG. 9, the voltage generation circuit 20 includes a regulator 21, a driver 22, and a transistor 23. The regulator 21 includes operational amplifiers OP1 and OP2, a transistor 24, and a constant voltage circuit 25.

The regulator 21 is connected to the input terminal of the driver 22 at the node VBLL. The node VBLL is grounded through the transistor 23, and is connected to the supply node of the power voltage through the transistor 24. The driver 22 receives the voltage from the regulator 21 at the node VBLL, and outputs the voltage SRCGND at the node SRCGND. The constant voltage circuit 25 outputs a certain voltage. The constant voltage is a target voltage SRCGND. The operational amplifier OP1 is connected to the node VBLL at the non-inverting input terminal (+), receives the reference voltage VREF1 at the inverting input terminal (−), and is connected to the gate of the transistor 23 at the output node. The operational amplifier OP2 is connected to the node VBLL at the non-inverting input, receives the reference voltage VREF1 at the inverting input, and is connected to the gate of the transistor 24 at the output node.

If the voltage of the node VBLL is higher than the voltage SRCGND, the operational amplifier OP1 turns on the transistor 23, and reduces the voltage of the node VBLL. In contrast, if the voltage of the node VBLL is lower than the voltage SRCGND, the operational amplifier OP2 turns on the transistor 24, and increases the voltage of the node VBLL. In this manner, the fixed voltage SRCGND is output from the regulator 21.

In order to generate two or more different voltages SRCGND (for example, SRCGND1, and SRCGND2), a regulator 21 for generating respective voltages is provided. Each regulator 21 generates a corresponding voltage SRCGND by using the constant voltage circuit 25.

3. Effect of First Embodiment

The effect of the first embodiment described above will be described below, along with the description of a comparative example.

In the sense amplifier of a current sensing scheme of the NAND-type flash memory, there is a waiting time until the voltage of the selected bit line BL and the change in the cell current stabilize. The "BL developing" time period depicted in FIGS. 5 to 7 indicates the waiting time until the voltage of the bit line BL and the change in the cell current stabilize.

For example, the bit line control method called lockout or no-lockout may be performed in consideration of the waiting time and the increase in the voltage of the source line. The lockout indicates that the bit line BL of the turned-on memory cell is fixed to a certain voltage. The fixed voltage is a source line voltage SRC. The two-time reading scheme performs the lockout during the A-level reading or the C-level reading. Further, the lockout may be performed until the C-level reading begins after the A-level reading. Meanwhile, the no-lockout corresponds to the one-time reading, in which the lockout is not performed between the A-level reading and the C-level reading.

It is possible to reduce the sum of the all currents in the memory cell array and read the data from the bit line through which a current flows very little with high accuracy, by indexing the memory cell which is turned on by the first reading, and causing the bit line connected to the memory cell to be locked out. Further, it is possible to suppress the current consumption in the memory cell array, by continuing the lockout performed during the A-level reading also during the C-level reading. However, during the lockout, the voltage of the bit line of the memory cell that is turned on varies from the pre-charge voltage to the source line voltage. Therefore, the bit line adjacent to the non-selected bit line receives coupling noise greater than when the lockout is not performed. Therefore, the waiting time is extended until the coupling noise stabilizes and the current and voltage of the selection bit line is stabilized. Thus, the reading time is long.

Meanwhile, in the read operation using no-lockout, when the A-level reading and the C-level reading are respectively performed once and completed, and the C-level reading is started, the lockout is not performed. Accordingly, the change in the voltage of the bit line BL of the turned-on memory cell is smaller than in the case of the lockout. However, since all bit lines are pre-charged at the start of the C-level reading, the current consumption is large.

In this manner, the read operation using either the lockout or the no-lockout has advantages and disadvantages, and is selectively used depending on the situation.

In contrast, in the first embodiment, before the second reading of the two-time reading scheme and before the C-level reading after the A-level reading, the bit line BL of the turned-on memory cell is maintained at the voltage SRCGND. Therefore, similar to the lockout, the suppression of current consumption and improvement of the reading accuracy are possible. Further, in the first embodiment, the voltage SRCGND is higher than the source voltage in the comparative example. Therefore, the amplitude of the change in the voltage of the bit line of the turned-on memory cell is smaller than in the case of the lockout, and the time it takes for the voltage of the bit line and the cell current to be stabilized is short. Meanwhile, at the start of the C-level reading, a difference between the voltages SRCGND of the bit lines BL of the turned-on memory cell and the pre-charge voltage BLPR is smaller than the difference between the voltage of the bit line in the no-lockout and the pre-charge voltage. Therefore, the current required for pre-charge is smaller than in the case of the no-lockout. Thus, according to the first embodiment, the reading may be implemented with a current smaller than in the case of no-lockout and a speed higher than in the case of lockout.

Figure 10:
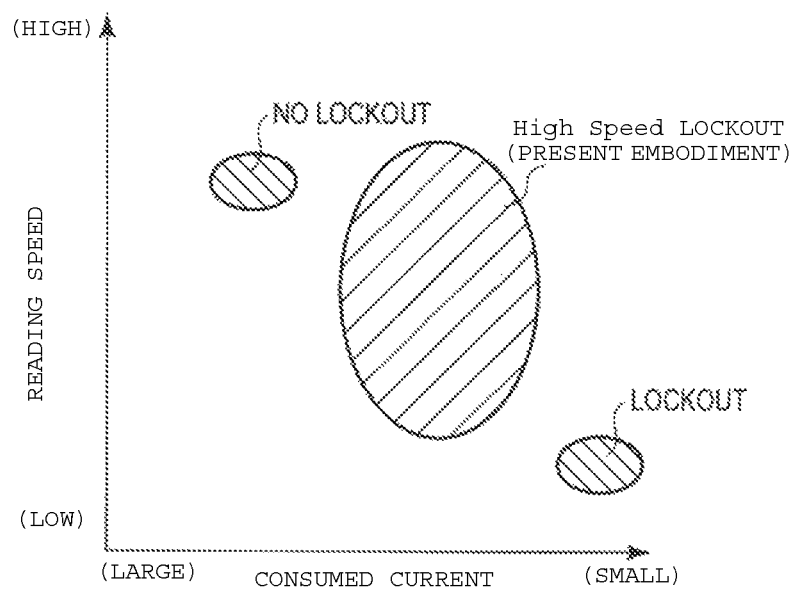
FIG. 10 is a diagram illustrating a difference between the first embodiment and a comparative example in a reading speed and a consumed current during the read operation.

FIG. 10 illustrates the difference in the reading speeds and the current consumptions in the first embodiment and the comparative example. In FIG. 10, the read operation in the first embodiment is denoted by "High Speed LOCKOUT".

As illustrated, in the read operation using lockout, the reading speed is slow, but current consumption is small. Further, in the read operation using no-lockout, the reading speed is fast, but current consumption is large. Compared to these, the reading speed in the first embodiment is substantially the same as that of the no-lockout operation. The current consumption in the first embodiment is greater than the lockout operation, and is smaller than the no-lockout operation.

(Second Embodiment)

Next, a semiconductor memory device according to a second embodiment will be described. In the first embodiment, the potential of the bit line BL of the turned-on memory cell is fixed by the connection to the node of the fixed voltage SRCGND, instead of the connection to the node of the voltage SRC. In the second embodiment, the voltage of the bit line BL of the turned-on memory cell is set to a value higher than the voltage SRC, by limiting the current flow. Except for the configuration and the operation described below, the configuration and the operation of the semiconductor memory device according to the second embodiment are the same as those of the first embodiment.

1. Current Control Circuit of Sense Amplifier

Figure 11:
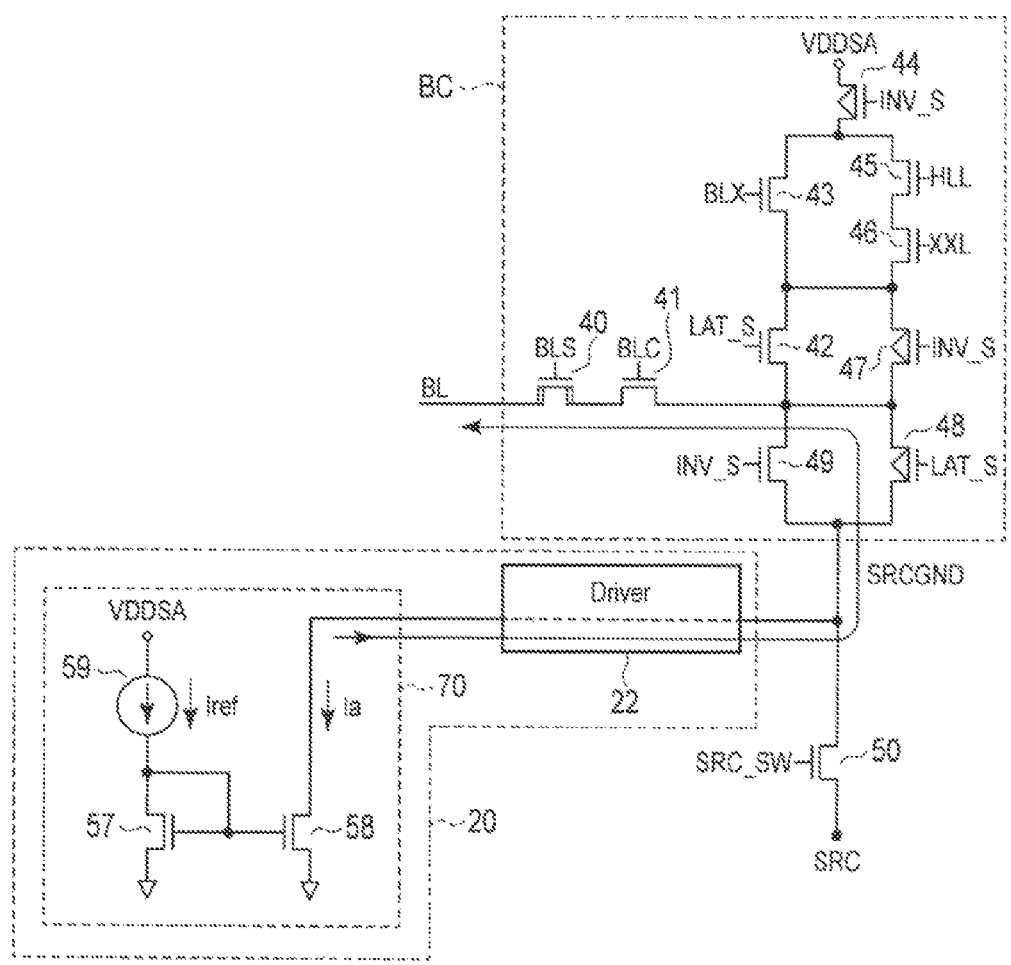
FIG. 11 is a circuit diagram illustrating a current limiting circuit in the sense amplifier according to a second embodiment.

First, the current limiting circuit of the sense amplifier unit SA will be described. As illustrated in FIG. 11, the sense amplifier unit SA, in particular the voltage generation circuit 20, includes a current limiting circuit 70, instead of the regulator 21 and the nMOS transistor 23 in FIG. 9. The current limiting circuit 70 limits the current flowing to the driver 22, and limits the amount of current from the node SRC to the source line SL and then through the sense amplifier unit SA and the bit line BL. The current limiting circuit 70 includes, for example, a current mirror circuit. The current mirror circuit includes nMOS transistors 57 and 58, and a constant current source 59. The constant current source 59 and the transistor 57 are connected in series between the supply node of the power voltage VDDSA and the ground node. The constant current source 59 supplies a reference current Iref. The transistor 58 is connected between an input terminal of the driver 22 and the ground node. The gate of the transistor 57 is connected to the connection node between the constant current source 59 and the transistor 57, and the gate of the transistor 58. By the current mirror circuit, a current Ia flows through the transistor 58.

By appropriately setting the reference current Iref and the channel widths W of the transistors 57 and 58, a desired current Ia is obtained. By the current Ia, the amount of a current flowing from the driver 22 to the node SRCGND varies, and thus the amount of current flowing to the source line SL through the sense amplifier unit SA and the bit line BL is limited. The voltage SRCGND has the size corresponding to the current Ia. The voltage SRCGND obtained in this manner, instead of the voltage SRC, is applied to the bit line BL of the turned-on memory cell.

2. Data Read Operation

The case of applying the two-time reading scheme to the reading of an upper bit for four-value cells will be described with reference to FIGS. 12 and 13. The sense amplifier unit SA performs the read operation which will be described later, for example, by the control circuit 14 controlling the various control signals.

Figure 12:
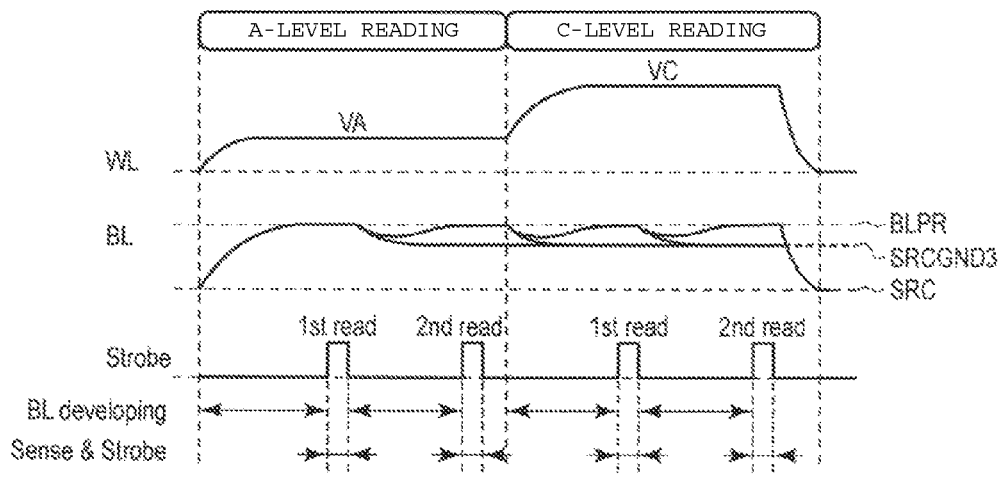
FIG. 12 is a timing chart illustrating a read operation of the semiconductor memory device according to a second embodiment.
Figure 13:
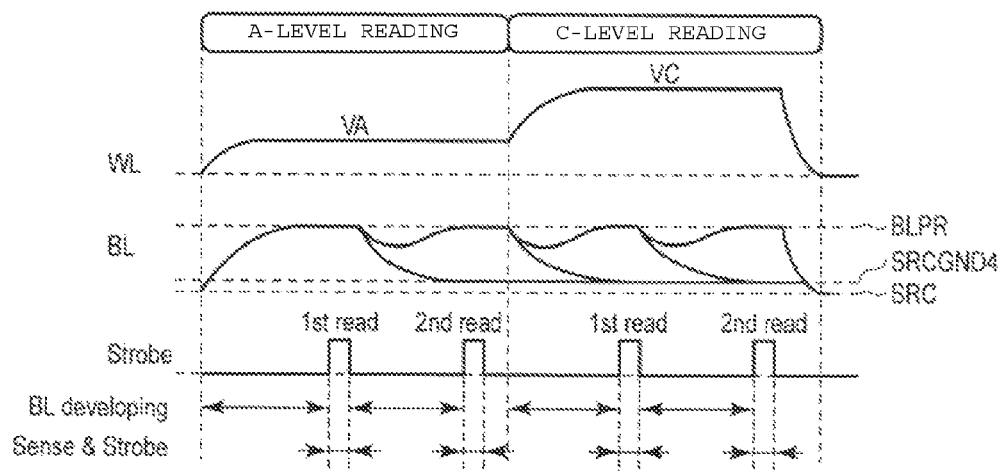
FIG. 13 is a timing chart illustrating the read operation of the semiconductor memory device according to the second embodiment.

As illustrated in FIGS. 12 and 13, the control circuit 14 performs its control such that the bit line BL of the turned-on memory cell is electrically connected to the node SRCGND, during the second reading, and until the C-level reading begins after the A-level reading. FIGS. 12 and 13 illustrate cases where the voltage of the node SRCGND is at voltages SRCGND3, and SRCGND4, respectively. Each of the voltages SRCGND3 and SRCGND4 has a size between the source line voltage SRC and the pre-charge voltage BLPR, and the SRCGND4 is lower than the SRCGND3.

The change in the voltage of the bit line BL after the sense is started is determined based on the pattern of the data of the page of the selected word line. For example, in a certain data pattern, there is a small decrease of the voltage of the bit line BL when the memory cell turns off from the pre-charge voltage BLPR. Meanwhile, in another data pattern, there is a great decrease of the voltage of the bit line BL when the memory cell turns off from the pre-charge voltage BLPR. FIG. 12 illustrates a case in which a decrease in the voltage of the bit line BL is smaller, and FIG. 13 illustrates a case in which the decrease in the voltage of the bit line BL is greater. Based on such a difference in the size of the decrease in the voltage of the bit line BL of the turned-on memory cell, in the case of FIG. 12, the voltage of the node SRCGND is large, for example, the voltage SRCGND3, and in the case of FIG. 13, the voltage of the node SRCGND is small, for example, the voltage SRCGND4.

The other points include the reading itself, and are the same as in the first embodiment.

In the case where the decrease in the voltage of the bit line BL is smaller, a time until the voltage of the bit line BL is stabilized is long. That is because there is a large variation in the voltages of the bit lines BL of the turned-on memory cell. Meanwhile, in the case where the decrease in the voltage of the bit line BL is small, the time until the voltage of the bit line BL is stabilized is short. In other words, the necessary waiting time varies depending on the sizes of a decrease in the voltage of the bit line BL. Meanwhile, as described above, the size of the node SRCGND varies, depending on the size of the decrease in the voltage of the bit line BL. In other words, the length of the necessary waiting time and the size of the voltage of the node SRCGND have a correlation. By using this, the control circuit 14 monitors the size of the voltage of the node SRCGND, and may change the waiting time until the bit line BL is stabilized, based on the size of the node SRCGND. A high-speed read operation is possible due to an optimization through a change in the waiting time.

3. Effect of Second Embodiment

Also in the second embodiment, similar to the first embodiment, during the second reading, and until the C-level reading begins after the A-level reading, the voltage of the bit line BL is set to a size between the voltage BLPR and the voltage SRC. Therefore, the same effect as that of the first embodiment is achieved.

Further, according to the second embodiment, a time required until the voltage of the bit line BL is stabilized is reflected in the size of the voltage SRCGND, and so the size of the voltage SRCGND is monitored, and the waiting time until the voltage of the bit line BL is stabilized is varied. Thus, it is possible to set an optimum waiting time, and to speed up the read operation.

Other Modifications

Other modifications of the first and second embodiments described above will be described.

1. First Modification

First, a modification of the second embodiment will be described. Below, the A-level reading will be described, but the same description is applicable to the C-level reading.

Figure 14:
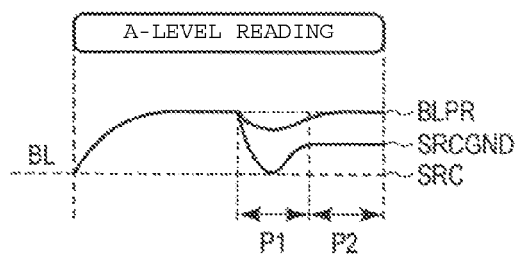
FIG. 14 is a timing chart illustrating a read operation according to a modification.

In the read operation illustrated in FIGS. 5, 6, 7, 12, and 13, the voltages of the bit lines BL of the turned-on memory cell begin to decrease from the pre-charge voltage BLPR to the voltage SRCGND. In the first modification, as illustrated in FIG. 14, the voltages of the bit lines BL of the turned-on memory cell is first lowered to the source line voltage SRC, and thereafter is raised to the voltage SRCGND.

Figure 15:
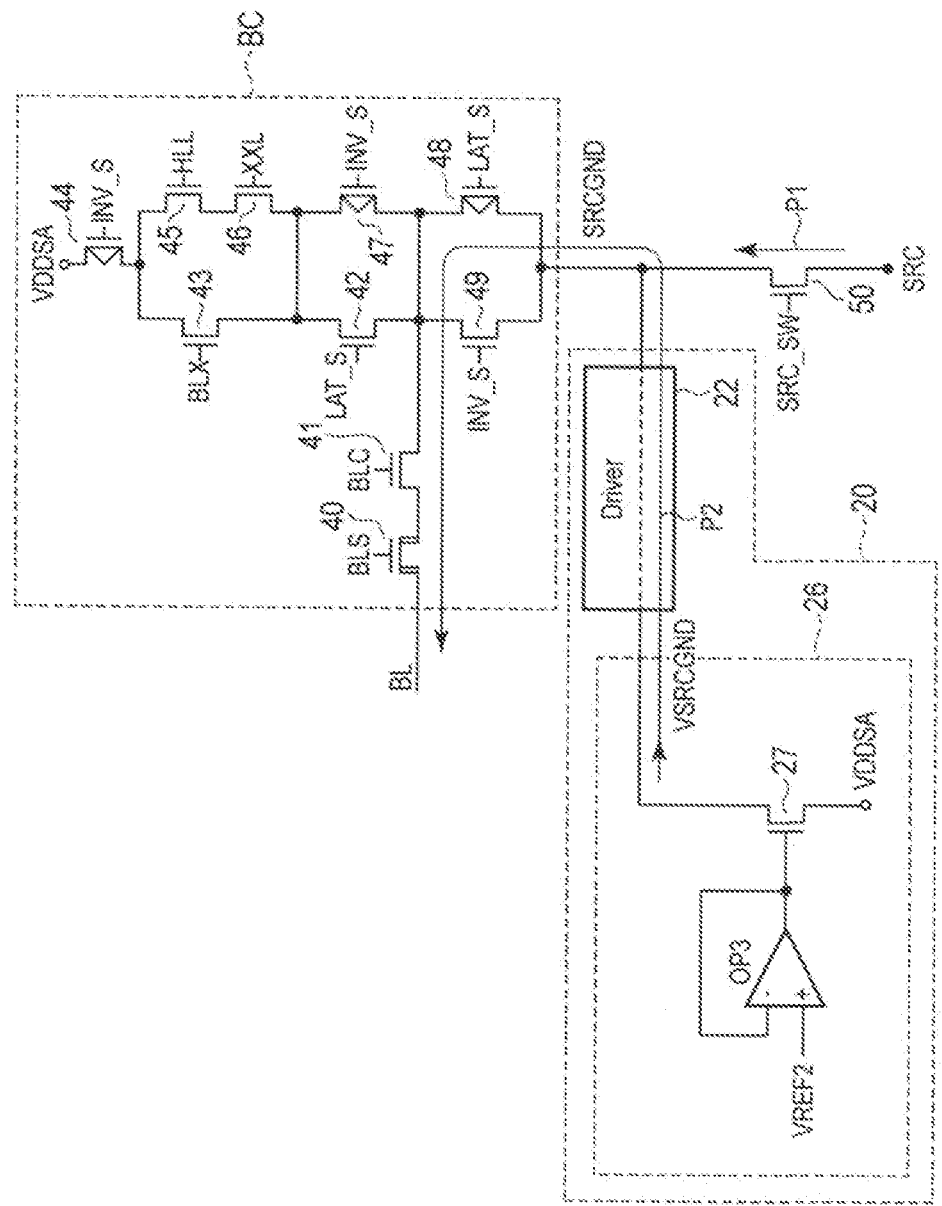
FIG. 15 is a circuit diagram illustrating a voltage generation circuit in a sense amplifier according to the modification.

First, a voltage generation circuit 20 of the first modification will be described with reference to FIG. 15. As illustrated in FIG. 15, the voltage generation circuit 20 includes a clamp unit 26, a driver 22, and an nMOS transistor 50. The clamp unit 26 includes an operational amplifier OP3 and an nMOS transistor 27, and outputs a voltage VSRCGND. The voltage VSRCGND is supplied to the driver 22. The voltage VSRCGND corresponds to the voltage SRCGND of a target bit line.

The nMOS transistor 27 is connected between the driver 22 and the node VDDSA, and has a threshold voltage Vth. A voltage VREF2 is input to the non-inverting input terminal of the operational amplifier OP3, and the output terminal of the operational amplifier OP3 is connected to the inverting input terminal and the gate of the nMOS transistor 27. The voltage VREF2 has a value obtained by adding the voltage VSRCGND and the threshold voltage Vth.

By the connections and the voltages of the elements, the operational amplifier OP3 operates so as to maintain the voltage at the output terminal at the voltage VREF2. Thus, the voltage VREF2 (=voltage VSRCGND+voltage Vth) is supplied to the gate of the nMOS transistor 27, and as a result, the clamp unit 26 outputs the voltage VSRCGND.

As illustrated in FIG. 14, after the first reading, the nMOS transistor 50 is turned on in a period P1, and the source line voltage SRC is supplied to the bit line BL of the turned-on memory cell. After the period P1, the nMOS transistor 50 is turned off. Accordingly, in the period P2, the voltage VSRCGND which is output from the clamp unit 26 is supplied to the bit line BL through the driver 22. Thus, as illustrated in FIG. 14, the voltage SRCGND of the bit line BL is first lowered to the voltage SRC, and thereafter may be increased to an intermediate voltage between the pre-charge voltage BLPR and the voltage SRC of the source line.

The voltages of the bit lines BL of the turned-on memory cell may be more quickly stabilized when the voltage is raised from the source line voltage SRC to the voltage SRCGND rather than when the voltages is lowered from the pre-charge voltage BLPR to the voltage SRCGND. In this case, by using the first modification, the voltages of the bit lines BL of the turned-on memory cell may be quickly stabilized. Further, according to the first modification, the same effect as that of the applied first or second embodiment may be achieved.

2. Second Modification

It is possible to apply the first and second embodiments to writing verification. The verification refers to a read operation for verifying whether writing is correctly performed.

Figure 16:
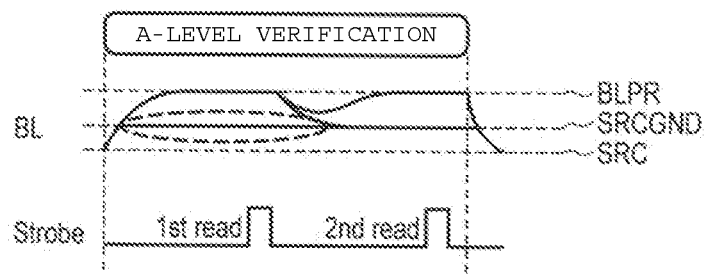
FIG. 16 is a timing chart illustrating a write verifying operation according to the modification.

The operation of the writing verification of the A-level will be described with reference to FIG. 16. During the writing verification of the A-level, it is not necessary to perform verification for the memory cell having a threshold voltage of the E-level. Accordingly, the bit line BL connected to the memory cell having the E-level does not need to be precharged. Thus, the control circuit 14 sets the voltage of such a bit line BL to the voltage SRCGND. Similarly, during the writing verification of the B-level, the bit line BL connected to the memory cell having the E-level and the A-level is set to the voltage SRCGND. The same is applied to the other levels.

According to the second modification, it is possible to achieve the same effect as that of the applied first or second embodiment, and it is possible to achieve the same effect as that of the first or second embodiment, even in the reading in the writing verification.

The embodiments are described, with a case of applying the embodiments to the memory cell capable of storing two bits of data as an example, but the embodiments may be applied to the memory cell capable of storing data of one bit or n bits (n is a natural number of three or more).

Further, the embodiment is not limited to a three-dimensional stacked NAND-type flash memory, and may be applied to other NAND-type flash memory in general. Further, respective embodiments may be implemented alone, and a plurality of combination-possible embodiments may be combined and implemented.

In addition, in the respective embodiments and modifications, (1) In the read operation, the voltage applied to the word line selected for the A-level read operation is, for example, 0 V to 0.55 V. Without being limited thereto, the voltage may be any of 0.1 V to 0.24 V, 0.21 V to 0.31 V, 0.31 V to 0.4 V, 0.4 V to 0.5 V, and 0.5 V to 0.55V.

The voltage applied to the word line selected for the B-level read operation is, for example, 1.5 V to 2.3 V. Without being limited thereto, the voltage may be any of 1.65 V to 1.8 V, 1.8V to 1.95 V, 1.95 V to 2.1 V, and 2.1 V to 2.3 V.

The voltage applied to the word line selected for the C-level read operation is, for example, 3.0 V to 4.0 V. Without being limited thereto, the voltage may be any of 3.0 V to 3.2 V, 3.2 V to 3.4 V, 3.4 V to 3.5 V, 3.5 V to 3.6 V, and 3.6 V to 4.0 V.

The time (tR) of the read operation may be, for example, 25 μs to 38 μs, 38 μs to 70 μs, and 70 μs to 80 μs.

(2) The writing operation includes a program operation and a verifying operation. In the writing operation, the voltage first applied to the word line selected during the program operation is, for example, 13.7 V to 14.3 V. Without being limited thereto, the voltage may be, for example, either 13.7 V to 14.0 V, or 14.0 V to 14.6 V. The voltage first applied to the word line selected in a case of writing the odd-numbered word lines and the voltage first applied to the word line selected in a case of writing the even-numbered word lines may be different.

When the program operation is an incremental step pulse program (ISPP) scheme, an example of a step-up voltage is about 0.5 V.

The voltage applied to the non-selected word line may be, for example, 6.0 V to 7.3 V. Without being limited to the case, the voltage may be, for example, 7.3 V to 8.4 V, or may be 6.0 V or less.

The pass voltage to be applied may vary, depending on whether the non-selected word line is an even-numbered word line or an odd-numbered word line.

The examples of time (tProg) of a write operation may be, for example, 1,700 μs to 1,800 μs, 1,800 μs to 1,900 μs, and 1,900 μs to 2,000 μs.

(3) In an erase operation, the voltage applied first to a well which is formed on the semiconductor substrate and on which the memory cell is disposed is, for example, 12 V to 13.6 V. Without being limited thereto, the voltage may be, for example, 13.6 V to 14.8 V, 14.8 V to 19.0 V, 19.0 V to 19.8 V, and 19.8 V to 21 V.

The time (tErase) of the erase operation may be, for example, 3,000 μs to 4,000 μs, 4,000 μs to 5,000 μs, and 4,000 μs to 9,000 μs.

(4) The structure of the memory cell has, a charge storage layer disposed through a tunnel insulating film of a film thickness of 4 to 10 nm on the semiconductor substrate (e.g., silicon substrate). The charge storage layer may be a stacked structure of an insulating film such as SiN or SiON of a film thickness of 2 to 3 nm, and a poly silicon of a film thickness of 3 to 8 nm. Further, a metal such as Ru may be added to the poly silicon. There is an insulating film on the charge storage layer. The insulating film includes, for example, a silicon oxide film of a film thickness of 4 to 10 nm which is sandwiched between a lower layer High-k film of a film thickness of 3 to 10 nm and an upper layer High-k film of a film thickness of 3 to 10 nm. The example of the High-k film is HfO. Further, the film thickness of the silicon oxide film may be thicker than the film thickness of the High-k film. A control electrode of a film thickness of 30 to 70 nm is formed on the insulating film, through a material of a film thickness of 3 to 10 nm. Here, the material for work function adjustment is a metal oxide film such as TaO and a metal nitride film such as TaN. It is possible to use W and the like for the control electrode.

Further, it is possible to form an air gap between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell;
a bit line electrically connected to a first end of the memory cell;
a source line electrically connected to a second end of the memory cell;
a sense amplifier electrically connected to the bit line; and
a controller configured to perform a read operation including first and second read operations on the memory cell,
wherein, during the first read operation, a pre-charge voltage is applied to the bit line and a source line voltage lower than the pre-charge voltage is applied to the source line, and during the second read operation, a first voltage that is greater than the source line voltage and less than the pre-charge voltage is applied to the bit line.

2. The device according to claim 1,
wherein the memory cell stores two or more bits of data and the first and second read operations are performed to distinguish among at least four threshold voltage levels of the memory cell.

3. The device according to claim 2,
wherein the memory cell is maintained off during the first read operation.

4. The device according to claim 1,
wherein the memory cell stores two or more bits of data and the read operation further includes third and fourth read operations, and
wherein the first, second, third, and fourth read operations are performed to distinguish among at least four threshold voltage levels of the memory cell.

5. The device according to claim 4,
wherein the memory cell is turned on during the first read operation.

6. The device according to claim 1,
wherein the read operation is performed as a verification operation after a write operation.

7. The device according to claim 1, further comprising:
a voltage generation circuit configured to generate the first voltage.

8. The device according to claim 7,
wherein during the second read operation, the sense amplifier initially applies the source line voltage to the bit line and then applies the first voltage to the bit line.

9. The device according to claim 1,
wherein the sense amplifier includes a current limiting circuit configured to set the first voltage by limiting a current flowing to the bit line.

10. A method of performing a read operation including first and second read operations in a semiconductor memory device having a memory cell, a bit line electrically connected to a first end of the memory cell, a source line electrically connected to a second end of the memory cell, and a sense amplifier electrically connected to the bit line, said method comprising:
during the first read operation, applying a pre-charge voltage to the bit line and a source line voltage lower than the pre-charge voltage to the source line; and
during the second read operation, applying a first voltage that is greater than the source line voltage and less than the pre-charge voltage to the bit line.

11. The method according to claim 10,
wherein the memory cell stores two or more bits of data and the first and second read operations are performed to distinguish among at least four threshold voltage levels of the memory cell.

12. The method according to claim 11,
wherein the memory cell is maintained off during the first read operation.

13. The method according to claim 10,
wherein the memory cell stores two or more bits of data and the read operation further includes third and fourth read operations, and
wherein the first, second, third, and fourth read operations are performed to distinguish among at least four threshold voltage levels of the memory cell.

14. The method according to claim 13,
wherein the memory cell is turned on during the first read operation.

15. The method according to claim 10,
wherein the read operation is performed as a verification operation after a write operation.

16. The method according to claim 10,
wherein the semiconductor memory device further comprising a voltage generation circuit configured to generate the first voltage.

17. The method according to claim 16,
wherein during the second read operation, the sense amplifier initially applies the source line voltage to the bit line and then applies the first voltage to the bit line.

18. The method according to claim 10,
wherein the sense amplifier includes a current limiting circuit configured to set the first voltage by limiting a current flowing to the bit line.

19. A semiconductor memory device comprising:
first and second memory cells, each configured to store two or more bits;
a first bit line electrically connected to a first end of the first memory cell;
a second bit line electrically connected to a first end of the second memory cell;
a source line electrically connected to second ends of the first and second memory cells;

a sense amplifier electrically connected to the first and second bit lines; and a controller configured to perform a read operation including first, second, third, and fourth read operations on the memory cell, to distinguish among at least four threshold voltage levels of the first and second memory cells, wherein during the first read operation, a pre-charge voltage is applied to the first and second bit lines and a source line voltage lower than the pre-charge voltage is applied to the source line, during the second read operation, the pre-charge voltage is applied to the first bit line and a first voltage that is greater than the source line voltage and less than the pre-charge voltage is applied to the second bit line, during the third read operation, the pre-charge voltage is applied to the first bit line, and during the fourth read operation, the first voltage is applied to the first bit line.

20. The device according to claim 19, wherein the first memory cell is maintained off during the first read operation and turned on during the second and third read operations, and the second memory cell is turned on during the first read operation.

* * * * *